United States Patent
Liu et al.

(10) Patent No.: US 9,344,043 B2
(45) Date of Patent: May 17, 2016

(54) OUTPUT BUFFER CIRCUIT, ARRAY SUBSTRATE AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Baoyu Liu, Beijing (CN); Liang Zhang, Beijing (CN); Yizhen Xu, Beijing (CN); Zhihua Sun, Beijing (CN)

(73) Assignees: BOE TECHNOLOGY GROUP CO., LTD., Beijing (CN); BEIJING BOE DISPLAY TECHNOLOGY CO., LTD., Beijing (CN)

(*) Notice: Subject to any disclaimer, the term of this patent is extended or adjusted under 35 U.S.C. 154(b) by 93 days.

(21) Appl. No.: 14/444,528

(22) Filed: Jul. 28, 2014

(65) Prior Publication Data

US 2015/0229273 A1    Aug. 13, 2015

(30) Foreign Application Priority Data

Feb. 10, 2014    (CN) .......................... 2014 1 0046370

(51) Int. Cl.
| H03F 1/02 | (2006.01) |
| G09G 3/36 | (2006.01) |
| H03F 3/45 | (2006.01) |

(52) U.S. Cl.
CPC ............ *H03F 1/0261* (2013.01); *G09G 3/3677* (2013.01); *H03F 3/45183* (2013.01); *G09G 2310/0291* (2013.01); *H03F 2203/45674* (2013.01)

(58) Field of Classification Search
None
See application file for complete search history.

(56) References Cited

U.S. PATENT DOCUMENTS

| 2005/0077957 A1 | 4/2005 | Kasai et al. |
| 2005/0195145 A1 | 9/2005 | Maki |
| 2008/0016847 A1 | 1/2008 | Arlt et al. |
| 2008/0169847 A1* | 7/2008 | Takenaka ............ H03F 3/45183 327/108 |

FOREIGN PATENT DOCUMENTS

| CN | 1804688 A | 7/2006 |
| CN | 102110425 A | 6/2011 |

OTHER PUBLICATIONS

Translation of first Chinese Office Action dated Jun. 3, 2015, for corresponding Chinese Application No. 201410046370.9.
Wei Tingcun et al., "Output Buffer Circuits for Medium or Small Size TFT-LCD Driver IC", Chinese Journal of Semiconductors, Vo. 27, No. 12, Dec. 2006.
Second Chinese Office Action dated Jan. 11, 2016, for corresponding Chinese Application No. 20140046370.9.

* cited by examiner

*Primary Examiner* — Kent Chang
*Assistant Examiner* — Nathan Brittingham
(74) *Attorney, Agent, or Firm* — Kinney & Lange, P.A.

(57) ABSTRACT

The embodiments of the present invention provide a output buffer circuit, comprising: a first stage operational amplifying circuit configured as a differential input circuit; a second stage operational amplifying circuit configured as a common source amplifying circuit having an active load; and a feedback circuit provided between the first stage operational amplifying circuit and the second stage operational amplifying circuit and configured to have driving capability of providing source current and sink current alternately. By forming a unit gain amplifier comprising the first stage operational amplifying circuit, the second stage operational amplifying circuit and the feedback circuit connected therebetween, the output buffer circuit has the driving capability of providing source current and sink current alternately. No special voltage stabilizing circuit is needed, thus the circuit structure is simple and the chip area is decreased; since the power consumption can be reduced without a special voltage stabilizing circuit, the fluctuation of the output voltage is suppressed at the same time, the stability of the circuit is ensured in operation and offset is suppressed optimally, the output signal is more accurate and the quality of image displayed is improved.

4 Claims, 2 Drawing Sheets

OUTPUT BUFFER CIRCUIT, ARRAY SUBSTRATE AND DISPLAY DEVICE

CROSS-REFERENCE TO RELATED APPLICATION

This application claims the benefit of Chinese Patent Application No. 201410046370.9 filed on Feb. 10, 2014 in the State Intellectual Property Office of China, the whole disclosure of which is incorporated herein by reference.

BACKGROUND OF THE INVENTION

1. Field of the Invention

Embodiments of present invention relate to the field of liquid crystal display, and in particular, to an output buffer circuit, an array substrate and a display device.

2. Description of the Related Art

Liquid crystal displayers are widely used because of its portable, ultrathin, multicolor and high definition characteristics. However, in the display field of the prior art, the power consumption of the entire voltage driving circuit of the displayer is becoming larger and larger with higher requirement for the resolution and the pixel quality of the displayer, thus the requirement for the power consumption of the driving control chip and the image quality of the liquid crystal screen is becoming higher and higher.

Currently, typical liquid crystal displayers mostly use TFT-LCD (Thin Film Transistor-Liquid Crystal Display) technology to get better image quality and lower power consumption as possible. Since output buffer circuits of the gate driving chip (i.e. Gate Driver) of the TFT-LCD are configured to directly drive capacitors on the liquid crystal screen, the performance thereof will directly affect the display quality of the liquid crystal screen. The requirement for the power consumption of the liquid crystal screen is higher and higher with the size of the liquid crystal screen becoming larger and larger. The schematic view of an output buffer circuit of a conventional gate driving chip is shown in FIG. 1. The output buffer circuit comprises a two-stage operational amplifying circuit, and a first stage operational amplifying circuit and a second stage operational amplifying circuit thereof are cascaded directly.

Since there is no feedback circuit provided in the output buffer circuit shown in the above FIG. 1, suppression of output fluctuations of the output buffer circuit may not be realized, thus the output voltage will have high fluctuation and low stability. In order to solve the problem of the instable output, a conventional output buffer circuit generally needs a special voltage stabilizing circuit in addition to the above two-stage operational amplifying circuit, thus the area of the chip is increased, a bias current of the output stage is needed to be increased at the meantime to increase the sink current to the load, and the power consumption is increased.

SUMMARY OF THE INVENTION

The embodiments of present invention provide an output buffer circuit, an array substrate and a display device, to suppress fluctuation of the output voltage of the output buffer circuit, such that the output voltage has good stability.

According to the embodiment of one aspect of the present invention, there is provided an output buffer circuit, comprising:

a first stage operational amplifying circuit configured to serve as a differential input circuit;

a second stage operational amplifying circuit configured to serve as a common source amplifying circuit having an active load; and a feedback circuit provided between the first stage operational amplifying circuit and the second stage operational amplifying circuit and configured to having driving capability of providing source current and sink current alternately.

According to the embodiment of another aspect of the present invention, there is provided an array substrate comprising the above output buffer circuit.

According to the embodiment of a further aspect of the present invention, there is provided a display device comprising the above array substrate.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF PREFERRED EMBODIMENTS OF THE INVENTION

The technical solutions in the embodiments of the present invention will be described clearly and completely hereinafter with reference to the attached drawings in the embodiments of the present invention. Apparently, the described embodiments are only part of the exemplary embodiments of the present invention and are not tended to covering all of the embodiments.

In addition, in the following detailed description, for the purposes of convenient explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
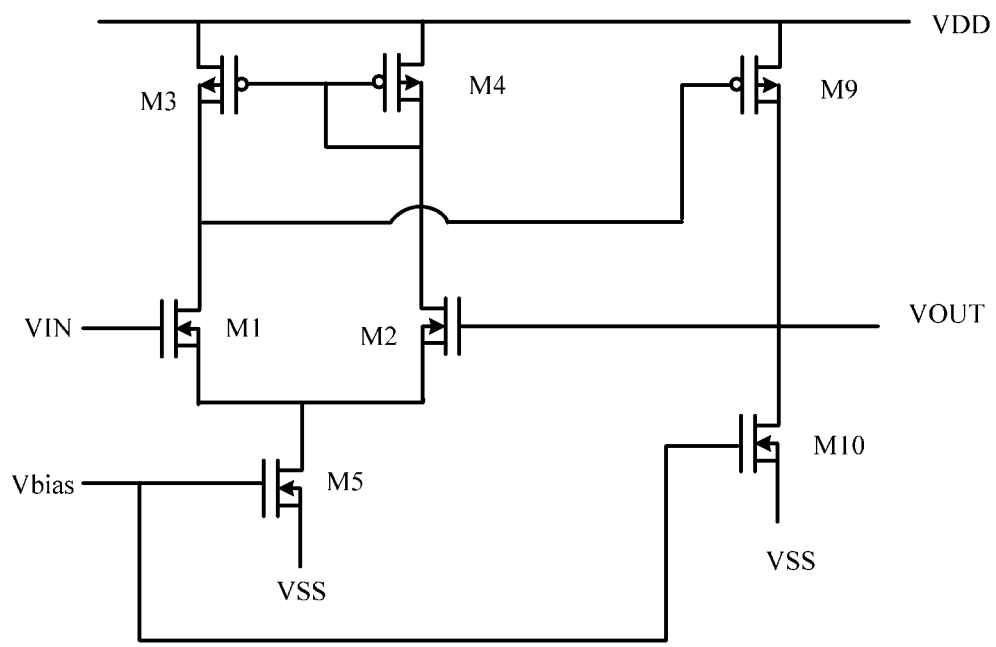
FIG. 1 is a circuit schematic view of an output buffer circuit in the prior art.

Currently, a normal output voltage of an output buffer circuit for providing the driving voltage VOFF of TFT-LCD gate driver is about −8V, and a voltage stabilizing capacitor needs to be externally connected. As shown in FIG. 1, the conventional output buffer circuit has a two-stage operational amplifying circuit, wherein a first stage operational amplifying circuit thereof is configured to be a differential input circuit comprising five transistors M1-M5, a second stage operation amplifying circuit thereof is configured to be a common source amplifying circuit comprising an active load of two transistors M9 and M10, to obtain higher gain and larger output voltage. In order to reduce the static power consumption, the bias current of transistors M10 and M9 is set relatively small, and a voltage negative feedback circuit is provided to make the two-stage operational amplifying circuit form a unit gain amplifier. The common source amplifying circuit that uses PMOS transistor M9 as the output driving transistor has only the capability of outputting source current for charging the voltage stabilizing capacitor. In order to absorb fluctuation of positive voltage and negative voltage at the same time of driving the voltage stabilizing capacitor, the output buffer circuit must have the capability of providing sink current to form a discharging circuit of the voltage stabilizing capacitor. Therefore, in the process of designing, it should be taken in consideration that this unit gain amplifier should have the capability of outputting the sink current. If the bias current of the output stage transistor M10 is to be increased, an impedance of the active load is decreased, which will lead to decreased gain of the operational amplifying circuit, thus the accuracy of the output voltage is reduced, even more severely, the static power consumption will be increased.

According to the general invention concept of various embodiments of the present invention, there is provided an output buffer circuit which may achieve capacity of outputting sink current by providing a source follower comprising an eighth transistor M8 and a voltage stabilizing capacitor C1 on the basis of a unit gain amplifier.

Figure 2:
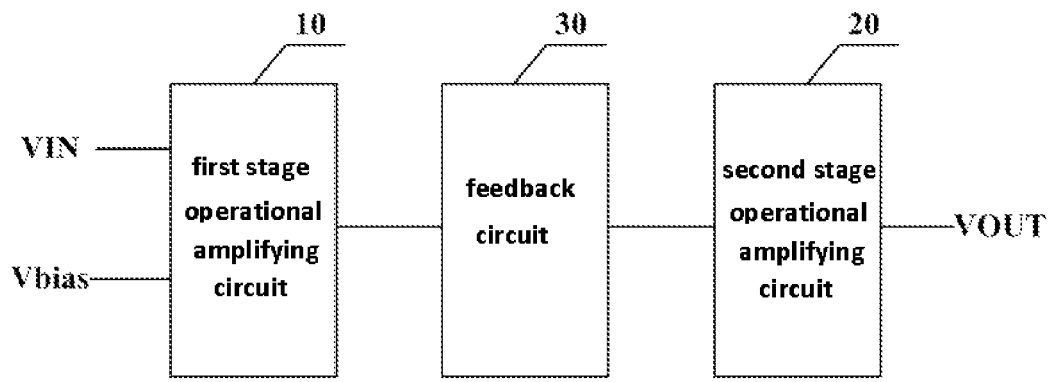
FIG. 2 is a principal block diagram of an output buffer circuit according to an exemplary embodiment of the present invention.

As shown in FIG. 2, according to the embodiment of one aspect of the present invention, there is provided an output buffer circuit comprising a first stage operational amplifying circuit 10, a second stage operational amplifying circuit 20 and a feedback circuit 30 provided between the first stage operational amplifying circuit 10 and the second stage operational amplifying circuit 20. The first stage operational amplifying circuit 10 is configured as a differential input circuit; the second stage operational amplifying circuit 20 is configured as a common source amplifying circuit of an active load; and the feedback circuit 30 is provided between the first stage operational amplifying circuit 10 and the second operational amplifying circuit 20 and is configured to provide driving capacity of source current and sink current alternately.

In the output buffer circuit according to the embodiment of the present invention, by providing the feedback circuit between the first stage operational amplifying circuit and the second stage operation amplifying circuit, negative feedback can be realized to control dynamically a work state of an output terminal of the output buffer circuit. When a high level is outputted from the output terminal, the output buffer circuit provides a load with current, thus driving capacity of "source current" is realized; when a low level is outputted, the output terminal of the output buffer circuit absorbs current of the load, thus driving capacity of "sink current" is realized. In this way, in the output buffer circuit, the driving capability of providing the source current and the sink current alternately is improved, then fluctuation of the output voltage is suppressed to ensure the stability of the output voltage.

Figure 3:
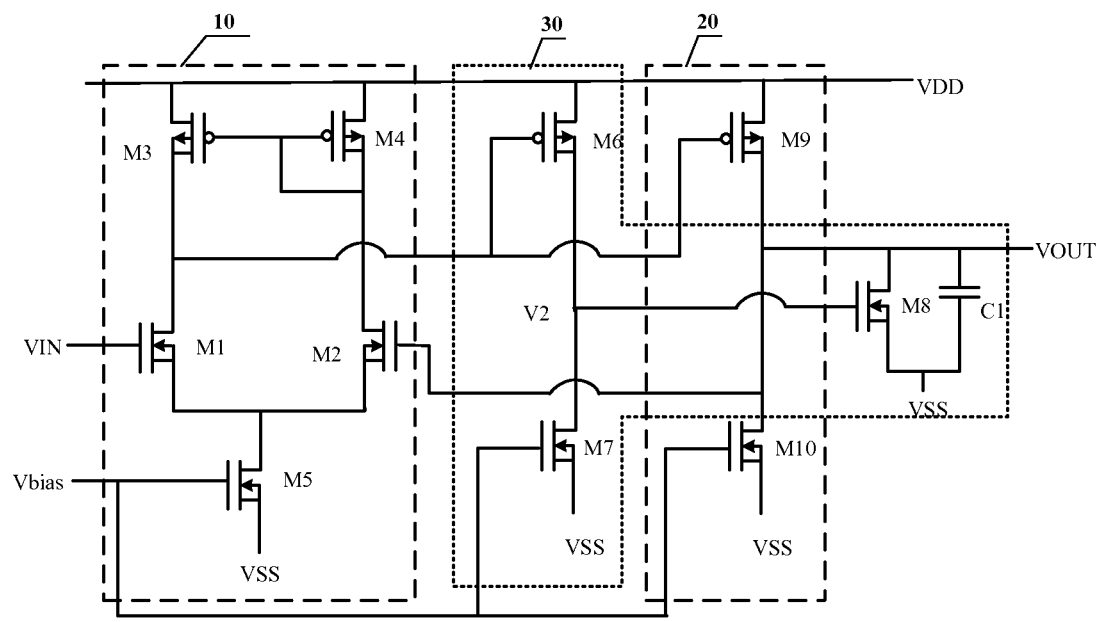
FIG. 3 is a circuit schematic view of an output buffer circuit according to an exemplary embodiment of the present invention.

In an exemplary embodiment, as shown in FIG. 3, a first stage operational amplifying circuit 10 of an output buffer circuit comprises: a first transistor M1, a gate thereof being connected with a signal input terminal VIN; a second transistor M2, a drain thereof being connected with a drain of the first transistor M1; a third transistor M3, a source thereof being connected with a supply voltage VDD, and a drain thereof being connected with a source of the first transistor M1; the fourth transistor M4, a source thereof being connected with the supply voltage VDD, and a gate thereof being connected with a drain thereof, the gate of the third transistor M3 and the source of the second transistor M2; and a fifth transistor M5, a gate thereof being connected with an bias voltage input terminal Vbias, a source thereof being connected with the drain of the first transistor M1 and the drain of the second transistor M2, and a drain thereof being connected with a common connection terminal voltage VSS. Wherein, the first transistor M1, the second transistor M2 and the fifth transistor M5 are NMOS transistors, the third transistor M3 and the fourth transistor M4 are PMOS transistors.

In a exemplary embodiment, the second stage operational amplifying circuit 20 comprises: a ninth transistor M9, a gate thereof being connected with the source of the first transistor M1 and the drain of the third transistor M3 of the first stage operational amplifying circuit 10, a source thereof being connected with the supply voltage VDD, and a drain thereof being connected with the gate of the second transistor M2 of the first operational amplifying circuit 10; and a tenth transistor M10, a gate thereof being connected with the bias voltage input terminal Vbias and the gate of the fifth transistor M5 of the first operational amplifying circuit 10, a source thereof being connected with the drain of the ninth transistor M9 and the gate of the second transistor M2 of the first operational amplifying circuit 10, and a drain thereof being connected with the common connection terminal voltage VSS. Wherein, the ninth transistor M9 is a PMOS transistor, the tenth transistor M10 is a NMOS transistor.

In an exemplary transistor, the feedback circuit 30 comprises: a sixth transistor M6, a gate thereof being connected with the source of the first transistor M1 and the drain of the third transistor M3 of the first stage operational amplifying circuit 10, and the gate of the ninth transistor M9 of the second operational amplifying circuit 20, and a source thereof being connected with the supply voltage VDD; a seventh transistor M7, a gate thereof being connected with the bias voltage input terminal Vbias, the gate of the fifth transistor M5 of the first operational amplifying circuit 10 and the gate of the tenth transistor M10 of the second operational amplifying circuit 20, and a drain thereof being connected with the common connection terminal voltage VSS; and an eight transistor M8, a gate thereof being connected with the drain of the sixth transistor M6 and the source of the seventh transistor M7, a source thereof being connected with a signal output terminal VOUT, the drain of the ninth transistor M9 of the second operational amplifying circuit 10 and the source of the tenth transistor M10 of the second operational amplifying circuit 20, and a drain thereof being connected with the common connection terminal voltage VSS. Wherein, the sixth transistor M6 and the eight transistor M8 are PMOS transistors, the seventh transistor M7 is a NMOS transistor.

In the above embodiment, the bias voltage input terminal Vbias provides the gates of the fifth transistor M5, the seventh transistor M7 and the tenth transistor M10 with this bias voltage by being connected with these gates, such that the fifth transistor M5, the seventh transistor M7 and the tenth transistor M10 are turned-on and work in the amplifying state.

In an embodiment, the output buffer circuit further comprises a voltage stabilizing capacitor C1. A first terminal of the voltage stabilizing capacitor C1 is connected with the source of the eighth transistor M8, and forms source follower together with the eighth transistor M8, to provide the capability of outputting the sink current. Both a second terminal of the voltage stabilizing capacitor C1 and the drain of the eighth transistor M8 are connected with the common connection terminal voltage VSS.

In an embodiment, the gate of the sixth transistor M6 of the feedback circuit 30 is connected with the drain of the third transistor M3 and the gate of the ninth transistor M9, the drain of the sixth transistor M6 is connected with the source of the seventh transistor M7, and a second bias voltage V2 is applied to this connection point thereof, the drain of the sixth transistor M6 is connected in turn with the gate of the eighth transistor M8. Therefore, the sixth transistor M6 and the seventh transistor M7 may provide the eighth transistor M8 with floating bias voltage V2 to ensure that the work state of the eighth transistor M8 is controlled dynamically by the bias voltage V2, i.e. the output voltage VOUT.

More specifically, when the output voltage VOUT is not affected by the feedback circuit, i.e. when the output voltage is normal value VOUT, the sizes of the sixth transistor M6 and the seventh transistor M7 are adjusted, such that $$VOUT-|Vth,M8|<V2<VDD-|Vds,M6| \qquad \text{equation (1)}$$

wherein, |Vth,M8| is the absolute value of the threshold voltage of PMOS transistor M8, and Vth,M8<0, |Vds,M6| is the saturated turn-on voltage of the PMOS transistor M6, the Vgs voltage of the eighth transistor M8 is:

$$Vgs=V2-VOUT \qquad \text{equation (2)}$$

it can be known from equations (1) and (2) that:

$$Vgs>-|Vth, M8|=Vth, M8 \qquad \text{equation (3)}$$

at this time, the Vgs voltage of the eighth transistor M8 is larger than the threshold voltage thereof, and transistor M8 is in a state of full turn-off. The performance of the two-stage gain amplifying circuit comprising the first and second stage operational amplifying circuits is not affected at all.

Wherein, adjusting the sizes of M6 and M7 mainly comprises altering the length-width ratio of the MOS transistor by adjusting the widths of M6 and M7, thus the source-drain voltage of the MOS transistor is altered. In this way, the control of the work state of the output terminal of the output buffer circuit is realized.

To sum up, the structure of the output buffer circuit as set forth in the above various embodiments of the present invention is simple and stable. The output buffer circuit realizes voltage stabilization by the feedback circuit comprising three transistors, and no special voltage stabilization circuit is needed, thus area of a gate driving chip comprising the output buffer circuit is reduced and the power consumption is decreased. The output buffer circuit according to the embodiments of the present invention is suitable to be applied to the driving circuit of TFT-LCD. Since there is output feedback in the driving circuit, the output signal is stable, the offset at the output terminal is suppressed optimally, and the output signal is more accurate, which improves the image quality.

According to the embodiment of another aspect of the present invention, there is provided an array substrate comprising the above output buffer circuit according to the above various embodiments.

According to the embodiment of a further aspect of the present invention, there is provided a display device comprising the array substrate having the output buffer circuit according to the above various embodiments, a color filter substrate and liquid crystal filled between the array substrate and the color filter substrate.

In the output buffer circuit, the array substrate and the display device according to the above various embodiments of the present invention, the output buffer circuit comprises the first stage operational amplifying circuit configured as the differential input circuit; the second stage operational amplifying circuit configured as the common source amplifying circuit having the active load; and the feedback circuit provided between the first stage operational amplifying circuit and the second stage operational amplifying circuit and configured to have the driving capability of providing the source current and the sink current alternately. By providing the feedback circuit in the output buffer circuit, the work state of the output terminal is dynamically controlled; by forming the unit gain amplifier comprising the first operational amplifying circuit, the second stage operational amplifying circuit and the feedback circuit connected therebetween, the output buffer circuit has the driving capability of providing the source current and the sink current alternately. There is no special voltage stabilizing circuit needed in the output buffer circuit, thus the circuit structure is simple and the chip area is decreased; since the power consumption can be reduced without a special voltage stabilizing circuit, the fluctuation of the output voltage is suppressed at the same time, the stability of the output buffer circuit is ensured in operation and offset is suppressed optimally, the output signal is more accurate and the quality of image displayed by the display device is improved.

The foregoing is only preferred embodiments of the present invention, but the protection scope of the present invention is not limited thereto. It would be appreciated by those skilled in the art that under the disclosure scope of the present invention, various changes or modifications may be made and be contained in the protection scope of the present invention. Therefore, the protection scope of the present invention is defined in the claims.

What is claimed is:

1. An output buffer circuit, comprising:
a first stage operational amplifying circuit configured as a differential input circuit;
a second stage operational amplifying circuit configured as a common source amplifying circuit having an active load; and
a feedback circuit provided between the first stage operational amplifying circuit and the second stage operational amplifying circuit and configured to have driving capability of providing source current and sink current alternately;
wherein said first stage operational amplifying circuit comprises:
 a first transistor, a gate thereof being connected with a signal input terminal;
 a second transistor, a drain thereof being connected with a drain of said first transistor;
 a third transistor, a source thereof being connected with a supply voltage, and a drain thereof is connected with a source of said first transistor;
 a fourth transistor, a source thereof being connected with the supply voltage, a gate thereof being connected with a drain of the fourth transistor, and said gate of the fourth transistor being connected with a gate of the third transistor and a source of the second transistor; and
 a fifth transistor, a gate thereof being connected with a bias voltage input terminal, a source thereof being connected with a drain of said first transistor and the drain of said second transistor, and a drain thereof being connected with a common connection terminal voltage;
 wherein, the first transistor, the second transistor and the fifth transistor are NMOS transistors, and the third transistor and the fourth transistor are PMOS transistors; and
wherein said second stage operational amplifying circuit comprises:
 a ninth transistor, a gate thereof being connected with the source of said first transistor of the first stage operational amplifying circuit, a source thereof being connected with a supply voltage, and a drain thereof being connected with the gate of said second transistor of the first stage operational amplifying circuit; and
 a tenth transistor, a gate thereof being connected with a bias voltage input terminal and the gate of said fifth transistor of the first stage operational circuit, a source thereof being connected with the drain of said ninth transistor, and a drain thereof being connected with the common connection terminal voltage;

wherein the ninth transistor is a PMOS transistor, and the tenth transistor is a NMOS transistor; and wherein said feedback circuit comprises:
a sixth transistor, a gate thereof being connected with the source of said first transistor of the first stage operational amplifying circuit, and a source thereof being connected with a supply voltage;
a seventh transistor, a gate thereof being connected with the bias voltage input terminal, and a drain thereof being connected with the common connection terminal voltage; and
an eighth transistor, a gate thereof being connected with the drain of said sixth transistor such that the drain of the sixth transistor provides said eighth transistor with a bias voltage, a source thereof being connected with a signal output terminal and the drain of the ninth transistor of the second operational amplifying circuit, and a drain thereof being connected with the common connection terminal voltage;
wherein, the sixth transistor and the eighth transistor are PMOS transistors, and the seventh transistor is a NMOS transistor.

2. The output buffer circuit according to claim 1, wherein, further comprising a voltage stabilizing capacitor, a first terminal of said voltage stabilizing capacitor being connected with the source of said eighth transistor, so that the voltage stabilizing capacitor and the eighth transistor compose a source follower, to provide the capability of outputting the sink current;

and a second terminal of the voltage stabilizing capacitor being connected with the common connection terminal voltage.

3. An array substrate comprising a plurality of output buffer circuits, each said output buffer circuit comprising:
a first stage operational amplifying circuit configured as a differential input circuit;
a second stage operational amplifying circuit configured as a common source amplifying circuit having an active load; and
a feedback circuit provided between the first stage operational amplifying circuit and the second stage operational amplifying circuit and configured to have driving capability of providing source current and sink current alternately;
wherein said first stage operational amplifying circuit comprises:
a first transistor, a gate thereof being connected with a signal input terminal;
a second transistor, a drain thereof being connected with a drain of said first transistor;
a third transistor, a source thereof being connected with a supply voltage, and a drain thereof being connected with a source of said first transistor;
a fourth transistor, a source thereof being connected with the supply voltage, a gate thereof being connected with a drain of the fourth transistor, said gate being connected with a gate of the third transistor and a source of the second transistor; and
a fifth transistor, a gate thereof being connected with a bias voltage input terminal, a source thereof being connected with a drain of said first transistor and the drain of said second transistor, and a drain thereof being connected with a common connection terminal voltage;
wherein, the first transistor, the second transistor and the fifth transistor are NMOS transistors, and the third transistor and the fourth transistor are PMOS transistors; and wherein said second stage operational amplifying circuit comprises:
a ninth transistor, a gate thereof being connected with the source of said first transistor of the first stage operational amplifying circuit, a source thereof being connected with a supply voltage, and a drain thereof being connected with the gate of said second transistor of the first stage operational amplifying circuit; and
a tenth transistor, a gate thereof being connected with a bias voltage input terminal and the gate of said fifth transistor of the first stage operational circuit, a source thereof being connected with the drain of said ninth transistor, and a drain thereof being connected with the common connection terminal voltage;
wherein the ninth transistor is a PMOS transistor, and the tenth transistor is a NMOS transistor; and wherein said feedback circuit comprises:
a sixth transistor, a gate thereof being connected with the source of said first transistor of the first stage operational amplifying circuit, and a source thereof being connected with a supply voltage;
a seventh transistor, a gate thereof being connected with the bias voltage input terminal, and a drain thereof being connected with the common connection terminal voltage; and
an eighth transistor, a gate thereof being connected with the drain of said sixth transistor such that the drain of said sixth transistor provides said eighth transistor with a bias voltage, a source thereof being connected with a signal output terminal and the drain of said ninth transistor of the second operational amplifying circuit, and a drain thereof being connected with the common connection terminal voltage;
wherein, the sixth transistor and the eighth transistor are PMOS transistors, and the seventh transistor is a NMOS transistor.

4. The array substrate according to claim 3, wherein, said output buffer circuit further comprises a voltage stabilizing capacitor, a first terminal of the voltage stabilizing capacitor being connected with the source of said eighth transistor, so that said voltage stabilizing capacitor and said eighth transistor compose a source follower, to provide the capability of outputting the sink current; and a second terminal of the voltage stabilizing capacitor being connected with the common connection terminal voltage.

* * * * *